United States Patent
Lochman et al.

(10) Patent No.: US 11,611,189 B2
(45) Date of Patent: Mar. 21, 2023

(54) SYSTEMS AND METHODS FOR ADDRESSING PUMPING OF THERMAL INTERFACE MATERIALS IN HIGH-POWER LASER SYSTEMS

(71) Applicant: PANASONIC INTELLECTUAL PROPERTY MANAGEMENT CO., LTD, Osaka (JP)

(72) Inventors: Bryan Lochman, Somerville, MA (US); Matthew Sauter, Cambridge, MA (US); Michael Denninger, Bedford, MA (US); Bien Chann, Merrimack, NH (US); Keita Inoue, Burlington, MA (US); John Roethle, Cambridge, MA (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 756 days.

(21) Appl. No.: 16/597,949

(22) Filed: Oct. 10, 2019

(65) Prior Publication Data
US 2020/0119511 A1   Apr. 16, 2020

Related U.S. Application Data

(60) Provisional application No. 62/745,622, filed on Oct. 15, 2018.

(51) Int. Cl.
*H01S 3/04* (2006.01)
*F28F 21/08* (2006.01)
(Continued)

(52) U.S. Cl.
CPC .......... *H01S 3/0405* (2013.01); *F28F 21/084* (2013.01); *H05K 7/2049* (2013.01); *H05K 7/20509* (2013.01); *H01S 5/024* (2013.01)

(58) Field of Classification Search
CPC .................................................. H01S 3/0405
(Continued)

(56) References Cited

U.S. PATENT DOCUMENTS 5,669,432 A  *  9/1997  Nisenson ................. E06B 9/68
                                                  160/307
2012/0328392 A1* 12/2012  Difante ............... F16B 13/0808
                                                  411/342
(Continued)

FOREIGN PATENT DOCUMENTS

CN   107853685 A   3/2018
JP   2004186212 A  7/2004
(Continued)

OTHER PUBLICATIONS

International Search Report and Written Opinion Corresponding to International Application No. PCT/US2019/055499 dated Jan. 31, 2020, 10 pages.

*Primary Examiner* — Tuan N Nguyen
(74) *Attorney, Agent, or Firm* — Morgan, Lewis & Bockius LLP

(57) ABSTRACT

In various embodiments, laser devices feature means, such as fasteners, for attaching a laser package to a cooling plate, which allow motion of the laser package in response to thermal cycles resulting from operation of a beam emitter therewithin. Embodiments of the invention additionally or instead include laser devices featuring segmented barrier layers for electrically isolating the laser package from the cooling plate.

27 Claims, 5 Drawing Sheets

(51) Int. Cl.
 *H05K 7/20* (2006.01)
 *H01S 5/024* (2006.01)
(58) Field of Classification Search
 USPC .......................................................... 372/34
 See application file for complete search history.

(56) References Cited

U.S. PATENT DOCUMENTS

2014/0334507 A1* 11/2014 Grove .................. H01S 5/02365
 372/34
2016/0218482 A1* 7/2016 Tayebati ............... H01S 5/0237

FOREIGN PATENT DOCUMENTS

| JP | 2006066664 A | 3/2006 |
| JP | 2006324334 A | 11/2006 |
| JP | 2014-183213 A | 9/2014 |

* cited by examiner

SYSTEMS AND METHODS FOR ADDRESSING PUMPING OF THERMAL INTERFACE MATERIALS IN HIGH-POWER LASER SYSTEMS

RELATED APPLICATIONS

This application claims the benefit of and priority to U.S. Provisional Patent Application No. 62/745,622, filed Oct. 15, 2018, the entire disclosure of which is hereby incorporated herein by reference.

TECHNICAL FIELD

In various embodiments, the present invention relates to laser systems incorporating interface materials for thermal management and means and techniques for minimizing or reducing pumping thereof.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber") or other propagation medium (e.g., free space), and an optical system that focuses the laser light onto the workpiece to be processed. In many such cases laser emission from multiple laser diode emitters or array of emitters (e.g., a laser bar or diode bar) are combined to form a high-power laser beam that enables such applications. While a variety of proprietary techniques have been developed to produce high-power laser beams with varying degrees of beam quality, a common challenge in such laser systems is efficient cooling and heat removal. Currently it is not unusual for a single diode bar to provide up to 300 W of power and to dissipate large amounts of heat in a 0.5 $cm^2$ area. To remove large amounts of heat, laser systems typically utilize heat sinks composed of thermally conductive metals or other materials to draw heat away from the laser emitter itself and eventually to cooling water in a laser housing on which the laser is mounted.

One of the key challenges in fabrication of laser systems is the interface structure between the laser package and the housing, which may be liquid-cooled. For example, imperfections in the thermal interface between the heat-emitting laser package and the housing can compromise heat-transfer efficacy. For example, voids or surface features such as unfilled surface roughness, may decrease the contact area between the laser package and the housing. While thermal compounds and soft metals such as indium foil have been developed to address some of these issues, many such compounds are subject to wear and/or creep under thermal cycling, rendering them less effective over time and/or removed entirely or in part from the interface. Thus, there is a need for thermal-management solutions that address these issues.

SUMMARY

In accordance with embodiments of the present invention, a laser device incorporating one or more beam emitters such as laser diodes (e.g., single laser diodes, laser diode bars, or arrays thereof) is packaged in a thermally conductive package and attached to a cooling plate, which may provide additional passive or active cooling. In various embodiments, the cooling plate also functions as a common platform for multiple such packaged laser devices, two or more of which may be electrically connected to each other (e.g., in series or in parallel). The laser device incorporates one or more layers of a thermal-interface material between the package and the cooling plate to improve thermal contact and thermal conduction away from the beam emitter (e.g., during operation). In various embodiments, the device also includes an electrically insulating barrier between the package and the cooling plate in order to prevent electrical conduction, through the cooling plate, between the device and other devices that may be installed on the cooling plate, which may include, but are not limited to, other laser devices and other optical, electronic, or optoelectronic devices such as controllers, actuators, motors, sensors, etc.

In various embodiments, the thermal-interface material is a conformal (e.g., gelatinous, semi-solid, liquid, etc.) material that is therefore prone to thermal pumping effects (i.e., mechanical wear and/or motion of the thermal-interface structure resulting from thermal cycling). For example, during operation of the system, the beam emitter may be repeatedly cycled on and off, resulting in thermal cycles that cause a cyclic force to be applied to the thermal-interface material. This cyclic force may give rise to pumping of the thermal-interface material out of the interface between the package and the cooling plate, thereby reducing thermal-management efficacy of the thermal-interface material and, in some cases, resulting in heat-induced failure of the system (e.g., of the beam emitter). The pumping of the thermal-interface material may be exacerbated by mismatch of the coefficients of thermal expansion (CTE) of the package, the barrier material, and/or the cooling plate. The CTE mismatch may result in shear stresses being applied to the thermal-interface material during thermal cycles, deleteriously increasing the pumping of the thermal-interface material away from the interface.

In various embodiments of the invention, an electrically insulating barrier may be disposed between the package and the cooling plate in order to prevent electrical conduction therebetween; however, the electrically insulating barrier is desirably thermally conductive in order to maximize the flow of heat from the package to the cooling plate. In various embodiments, a ceramic (e.g., aluminum nitride, boron arsenide, and/or beryllium oxide), nonconductive graphite, or diamond layer or material, or combination of two or more of these or one or more of these with one or more other materials (which may be electrically conductive) may be utilized as the electrically insulating barrier. For example, the barrier may be a multi-layer structure, and one or more of the layers may include, consist essentially of, or consist of one or more of the above materials. In various embodiments, one or more of the other layers may include, consist essentially of, or consist of an electrically conductive layer such as a metal, as long as one or more other layers is electrically insulating.

Laser systems in accordance with embodiments of the present invention reduce, minimize, or substantially eliminate thermal pumping of thermal-interface materials, and/or failures induced thereby, in at least one of two different ways. First, systems in accordance with embodiments of the invention incorporate one or more mechanisms that maintain the thermal (and/or mechanical) connection between the package and the cooling plate while allowing for thermally induced expansion and contraction in order to reduce or substantially eliminate the pumping force experienced by the thermal-interface material. For example, in various embodiments, the package is mechanically coupled to the cooling plate (with the thermal-interface material therebetween) via a fastener (such as a screw) equipped with a spring allowing movement of the package away from the cooling plate during thermal cycles. The fastener and spring provide sufficient coupling force to compress the thermal-interface material during unheated (or "cold") conditions (e.g., installation, downtime, etc.), thereby maximizing the efficacy of the thermal-interface material as a conductor of heat away from the package, while also reducing or minimizing the variation of force due to thermal expansion and contraction of the package (and/or other system components). While exemplary embodiments detailed herein utilize one or more screws as fasteners, other types of fasteners may also be utilized, e.g., bolts, rivets, anchors, rods, inserts, etc. Herein, "screw" refers to any elongated fastener that is threaded or otherwise patterned along at least a portion of its length (e.g., a threaded bolt), and the distal end of the screw may be flat or pointed; the threads or other pattern may be designed to interface and/or interlock with complementary threads in the object to which the screw is fastened.

Alternatively or in addition, embodiments of the present invention incorporate electrically insulating barrier layers that are divided into multiple discrete areal sections, such that the thermal pumping of the thermal-interface material due to, e.g., CTE mismatch between the barrier layer and the laser package (and/or one or more components thereof, including the beam emitter) is reduced or minimized. That is, the electrically insulating barrier layer may not cover the entire interface, as empty gaps will be present between the various sections of the material, and the electrically insulating barrier layer will cover less than 100% of the interface. In various embodiments, the discrete areal sections constitute only a single layer providing incomplete areal coverage of the interface, as opposed to multi-layered segmented electrically insulating barrier layers (e.g., that cover the entire interface).

In various embodiments, the electrically insulating barrier layer may be divided into smaller sections proximate locations of the package that experience higher temperatures (i.e., more heating) during operation in order to decrease the amount of thermally induced stress experienced in those areas. For example, in various laser device in accordance with embodiments of the invention, the regions of the package directly underlying the beam emitter (e.g., a laser diode or diode bar) may locally experience more heating than surrounding or other regions. Thus, in various embodiments of the invention, the electrically insulating barrier layer and/or thermal-interface material thereon experiences reduced thermally induced stress. In various embodiments, the surfaces of the package and/or the cooling plate facing the divided electrically insulating barrier layer are nominally flat, i.e., free of projections or recesses (e.g., trenches) that may influence the configuration of the electrically insulating barrier layer. While embodiments of the invention feature divided electrically insulating barrier layers, such layers are sufficient (e.g., have sufficient thickness) to prevent electrical contact between the laser device (or an electrically conductive part of the package) and the underlying cooling plate.

In various embodiments, the thermal-interface material is a gelatinous material or paste, e.g., a thermal grease or thermal gel. The thermal-interface material may include, consist essentially of, or consist of, for example, a thermally conductive solder, foil, paste, or gel material such as indium (e.g., indium paste or solder) or silver paste. The thermal-interface material may even include, consist essentially of, or consist of a liquid material, for example as disclosed in U.S. Provisional Patent Application No. 62/649,145, filed on Mar. 28, 2018, the entire disclosure of which is incorporated by reference herein.

In various embodiments, the thermal-interface material includes, consists essentially of, or consists of a thermal grease, such as a silicone-based non-curing grease. In various embodiments, the thermal-interface material includes, consists essentially of, or consists of a phase-change material, i.e., a material that at least partially transitions from a solid state to a liquid or gel state when its temperature reaches the phase-change (e.g., melt) temperature, and vice versa. Examples of phase-change materials include the Tmate and Tpcm series of materials available from Laird Technologies. In various embodiments, the phase-change material includes, consists essentially of, or consists of a carrier (e.g., wax such as paraffin wax) with particles dispersed therein. Exemplary particles include ceramic particles, e.g., boron nitride particles. Exemplary phase-change materials may also include one or more thin metal layer (e.g., foils) as reinforcement. At room temperature, phase-change materials may have the form of a sheet or pad, or a film or a paste. Exemplary phase-change materials are solid at room temperature and have a phase-change temperature below an operating temperature of the laser device (or a temperature reached during a thermal cycle experienced by all or a portion of the laser device, or below a temperature of all or a portion of the laser package when the device is operating at the operating temperature).

In various embodiments, the thermal-interface material is free of particles, posts, wires, mesh, or other solid features or elements. The thermal-interface material, in various embodiments, has a thermal conductivity of at least 1 watts per meter per Kelvin ($W \cdot m^{-1} \cdot K^{-1}$), at least 5 $W \cdot m^{-1} \cdot K^{-1}$, at least 10 $W \cdot m^{-1} \cdot K^{-1}$, at least 15 $W \cdot m^{-1} \cdot K^{-1}$, or even at least 20 $W \cdot m^{-1} \cdot K^{-1}$ in the "z" direction, i.e., the direction (typically vertical or transverse) extending from the cooling plate to the laser package or vice versa. The thermal conductivity of the thermal-interface material may be less than approximately 300 $W \cdot m^{-1} \cdot K^{-1}$, less than approximately 250 $W \cdot m^{-1} \cdot K^{-1}$, less than approximately 200 $W \cdot m^{-1} \cdot K^{-1}$, less than approximately 150 $W \cdot m^{-1} \cdot K^{-1}$, less than approximately 100 $W \cdot m^{-1} \cdot K^{-1}$, or even less than approximately 50 $W \cdot m^{-1} \cdot K^{-1}$. In various embodiments, layers of thermal-interface material are disposed between the laser package and the electrically insulating barrier and/or between the electrically insulating barrier and the cooling plate.

In various embodiments of the invention, the cooling plate may include, consist essentially of, or consist of, for example, copper, aluminum, and/or one or more other metals and/or thermally conductive materials. The thermal conductivity of the cooling plate may be higher than that of the thermal-interface material. The cooling plate may incorporate one or more hollow channels therewithin through which a liquid coolant such as water may be flowed to expedite thermal flow out of the laser package. The packaged beam emitter may thus be thermally coupled to the cooling plate via the thermal-interface system that includes the thermal-interface material and utilized in a high-power laser system (e.g., a wavelength-beam combining (WBC) laser system and/or a laser system coupling an input beam into an optical fiber).

As utilized herein, materials with a high thermal conductivity, or "highly thermally conductive materials," such as those that may be utilized for cooling plates or other heat sinks, have a thermal conductivity of at least 100 $W \cdot m^{-1} \cdot K^{-1}$, at least 170 $W \cdot m^{-1} \cdot K^{-1}$, at least 200 $W \cdot m^{-1} \cdot K^{-1}$, at least 250 $W \cdot m^{-1} \cdot K^{-1}$, or even at least 300 $W \cdot m^{-1} \cdot K^{-1}$. As utilized herein, materials with a high electrical conductivity, or "electrically conductive materials," have an electrical conductivity, e.g., at 20° C., of at least $1\times10^5$ siemens per meter (S/m), at least $1\times10^6$ S/m, or even at least $1\times10^7$ S/m. As utilized herein, materials with a high electrical resistivity, or "electrically insulating materials," have an electrical resistivity of at least $1\times10^8$ ohm·meter ($\Omega$·m), at least $1\times10^{10}\Omega$·m, or even at least $1\times10^{12}\Omega$·m.

Laser devices in accordance with embodiments of the present invention may be utilized in WBC systems to form high brightness, low beam parameter product (BPP) laser systems. The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

WBC is a technique for scaling the output power and brightness from laser diodes, laser diode bars, stacks of diode bars, or other lasers arranged in a one- or two-dimensional array. Beam emitters packaged in accordance with embodiments of the present invention may be utilized in WBC systems. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

Embodiments of the present invention couple one or more input laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

A laser diode, such as a laser diode described in the following general description may be used in association with embodiments of the innovations described herein. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double heterostructure lasers that include a layer of low bandgap material sandwiched between two high bandgap layers; quantum well lasers that include a very thin middle layer (quantum well layer) resulting in high efficiency and quantization of the laser's energy; multiple quantum well lasers that include more than one quantum well layer improve gain characteristics; quantum wire or quantum sea (dots) lasers replace the middle layer with a wire or dots that produce higher efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting-laser (VECSELs) and external-cavity diode lasers, which are tunable lasers that use mainly double heterostructure lasers and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power; tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

Laser diode arrays, bars and/or stacks may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 $\mu m \times 100$ $\mu m$. The beam quality along the 1 $\mu m$ dimension or fast-axis is typically diffraction-limited. The beam quality along the 100 $\mu m$ dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

In an aspect, embodiments of the invention feature a laser device including, consisting essentially of, or consisting of a beam emitter, a laser package, a thermally conductive cooling plate for conducting heat away from the laser package, an electrically isolating barrier layer for preventing electrical conduction between the laser package and the cooling plate, a first thermal-interface material, a second thermal-interface material, and means for attaching the laser package to the cooling plate, with the barrier layer and first and second thermal-interface materials therebetween, and allowing motion of the laser package in response to thermal cycles resulting from operation of the beam emitter. The laser package may include, consist essentially of, or consist of a thermally conductive bottom laser cooler disposed below and in thermal contact with the beam emitter. The laser package may include, consist essentially of, or consist of (i) a thermally conductive top laser cooler disposed above and in thermal contact with the beam emitter and (ii) a thermally conductive bottom laser cooler disposed below and in thermal contact with the beam emitter. The cooling plate is disposed below the laser package. The barrier layer is disposed between the laser package and the cooling plate. The first thermal-interface material is disposed between the laser package and the barrier layer. The second thermal-interface material is disposed between the barrier layer and the cooling plate. Motion of the first and second thermal-interface materials away from the interface between the laser package and the cooling plate may be reduced.

Embodiments of the invention may include one or more of the following in any of a variety of combinations. The attachment means may include, consist essentially of, or consist of an elastic member and a fastener, the fastener attaching the laser package to the cooling plate and compressing the elastic member. The elastic member may be configured to be additionally compressed in response to thermally induced expansion of the laser package. The fastener may include, consist essentially of, or consist of one or more screws. The elastic member may include, consist essentially of, or consist of at least one spring. The beam emitter may include, consist essentially of, or consist of a diode bar configured to emit multiple discrete beams. The top laser cooler and/or the bottom laser cooler may include, consist essentially of, or consist of copper. The cooling plate may include, consist essentially of, or consist of aluminum. The barrier layer may include, consist essentially of, or consist of aluminum nitride. The first thermal-interface material and/or the second thermal-interface material may include, consist essentially of, or consist of a gel, a solder, a paste, or a liquid. The first thermal-interface material and/or the second thermal-interface material may include, consist essentially of, or consist of a phase-change material. The laser device may include a second laser package disposed over and/or fastened to the cooling plate. A bus bar may electrically connect the laser package to the second laser package. The second laser package may have a second beam emitter disposed therein. The electrically isolating barrier layer may include, consist essentially of, or consist of a plurality of discrete sections with gaps therebetween. The electrically isolating barrier layer may include, consist essentially of, or consist of one or more layers extending gaplessly between the laser package and the cooling plate. The first thermal-interface material and the second thermal-interface material may include, consist essentially of, or consist of the same material. The first thermal-interface material and the second thermal-interface material may include, consist essentially of, or consist of different materials.

In another aspect, embodiments of the invention feature a laser device including, consisting essentially of, or consisting of a beam emitter, a laser package, a thermally conductive cooling plate for conducting heat away from the laser package, an electrically isolating barrier layer for preventing electrical conduction between the laser package and the cooling plate, a thermal-interface material, and means for attaching the laser package to the cooling plate, with the barrier layer and thermal-interface material therebetween, and allowing motion of the laser package in response to thermal cycles resulting from operation of the beam emitter. The laser package may include, consist essentially of, or consist of a thermally conductive bottom laser cooler disposed below and in thermal contact with the beam emitter. The laser package may include, consist essentially of, or consist of (i) a thermally conductive top laser cooler disposed above and in thermal contact with the beam emitter and (ii) a thermally conductive bottom laser cooler disposed below and in thermal contact with the beam emitter. The cooling plate is disposed below the laser package. The barrier layer is disposed between the laser package and the cooling plate. The thermal-interface material is disposed (i) between the laser package and the barrier layer or (ii) between the barrier layer and the cooling plate. Motion of the thermal-interface material away from the interface between the laser package and the cooling plate may be reduced.

Embodiments of the invention may include one or more of the following in any of a variety of combinations. The thermal-interface material may be disposed between the laser package and the barrier layer. The thermal-interface material may be disposed between the barrier layer and the cooling plate. The attachment means may include, consist essentially of, or consist of an elastic member and a fastener, the fastener attaching the laser package to the cooling plate and compressing the elastic member. The elastic member may be configured to be additionally compressed in response to thermally induced expansion of the laser package. The fastener may include, consist essentially of, or consist of one or more screws. The elastic member may include, consist essentially of, or consist of at least one spring. The beam emitter may include, consist essentially of, or consist of a diode bar configured to emit multiple discrete beams. The top laser cooler and/or the bottom laser cooler may include, consist essentially of, or consist of copper. The cooling plate may include, consist essentially of, or consist of aluminum. The barrier layer may include, consist essentially of, or consist of aluminum nitride. The thermal-interface material may include, consist essentially of, or consist of a gel, a solder, a paste, or a liquid. The thermal-interface material may include, consist essentially of, or consist of a phase-change material. The laser device may include a second laser package disposed over and/or fastened to the cooling plate. A bus bar may electrically connect the laser package to the second laser package. The second laser package may have a second beam emitter disposed therein. The electrically isolating barrier layer may include, consist essentially of, or consist of a plurality of discrete sections with gaps therebetween. The electrically isolating barrier layer may include, consist essentially of, or consist of one or more layers extending gaplessly between the laser package and the cooling plate.

In yet another aspect, embodiments of the invention feature a laser device including, consisting essentially of, or consisting of a beam emitter, a laser package, a thermally conductive cooling plate for conducting heat away from the laser package, an electrically isolating barrier layer for preventing electrical conduction between the laser package and the cooling plate, a first thermal-interface material, and a second thermal-interface material. The laser package may include, consist essentially of, or consist of a thermally conductive bottom laser cooler disposed below and in thermal contact with the beam emitter. The laser package may include, consist essentially of, or consist of (i) a thermally conductive top laser cooler disposed above and in thermal contact with the beam emitter and (ii) a thermally conductive bottom laser cooler disposed below and in thermal contact with the beam emitter. The cooling plate is disposed below the laser package. The barrier layer is disposed between the laser package and the cooling plate. The first thermal-interface material is disposed between the laser package and the barrier layer. The second thermal-interface material is disposed between the barrier layer and the cooling plate. The electrically isolating barrier layer includes, consists essentially of, or consists of a plurality of discrete areal sections with gaps therebetween.

Embodiments of the invention may include one or more of the following in any of a variety of combinations. The beam emitter may include, consist essentially of, or consist of a diode bar configured to emit multiple discrete beams. The top laser cooler and/or the bottom laser cooler may include, consist essentially of, or consist of copper. The cooling plate may include, consist essentially of, or consist of aluminum. The barrier layer may include, consist essentially of, or consist of aluminum nitride. The first thermal-interface material and/or the second thermal-interface material may include, consist essentially of, or consist of a gel, a solder, a paste, or a liquid. The first thermal-interface material and/or the second thermal-interface material may include, consist essentially of, or consist of a phase-change material. The laser device may include a second laser package disposed over and/or fastened to the cooling plate. A bus bar may electrically connect the laser package to the second laser package. The second laser package may have a second beam emitter disposed therein. The first thermal-interface material and the second thermal-interface material may include, consist essentially of, or consist of the same material. The first thermal-interface material and the second thermal-interface material may include, consist essentially of, or consist of different materials.

In another aspect, embodiments of the invention feature a laser device including, consisting essentially of, or consisting of a beam emitter, a laser package, a thermally conductive cooling plate for conducting heat away from the laser package, an electrically isolating barrier layer for preventing electrical conduction between the laser package and the cooling plate, and a thermal-interface material. The laser package may include, consist essentially of, or consist of a thermally conductive bottom laser cooler disposed below and in thermal contact with the beam emitter. The laser package may include, consist essentially of, or consist of (i) a thermally conductive top laser cooler disposed above and in thermal contact with the beam emitter and (ii) a thermally conductive bottom laser cooler disposed below and in thermal contact with the beam emitter. The cooling plate is disposed below the laser package. The barrier layer is disposed between the laser package and the cooling plate. The thermal-interface material is disposed (i) between the laser package and the barrier layer or (ii) between the barrier layer and the cooling plate. The electrically isolating barrier layer includes, consists essentially of, or consists of a plurality of discrete areal sections with gaps therebetween.

Embodiments of the invention may include one or more of the following in any of a variety of combinations. The thermal-interface material may be disposed between the laser package and the barrier layer. The thermal-interface material may be disposed between the barrier layer and the cooling plate. The beam emitter may include, consist essentially of, or consist of a diode bar configured to emit multiple discrete beams. The top laser cooler and/or the bottom laser cooler may include, consist essentially of, or consist of copper. The cooling plate may include, consist essentially of, or consist of aluminum. The barrier layer may include, consist essentially of, or consist of aluminum nitride. The thermal-interface material may include, consist essentially of, or consist of a gel, a solder, a paste, or a liquid. The thermal-interface material may include, consist essentially of, or consist of a phase-change material. The laser device may include a second laser package disposed over and/or fastened to the cooling plate. A bus bar may electrically connect the laser package to the second laser package. The second laser package may have a second beam emitter disposed therein.

In yet another aspect, embodiments of the invention feature a laser device including, consisting essentially of, or consisting of a beam emitter, a laser package, a thermally conductive cooling plate for conducting heat away from the laser package, an electrically isolating barrier layer for preventing electrical conduction between the laser package and the cooling plate, a first thermal-interface material, a second thermal-interface material, and a fastener for attaching the laser package to the cooling plate, with the barrier layer and first and second thermal-interface materials therebetween, and allowing motion of the laser package in response to thermal cycles resulting from operation of the beam emitter. The laser package may include, consist essentially of, or consist of a thermally conductive bottom laser cooler disposed below and in thermal contact with the beam emitter. The laser package may include, consist essentially of, or consist of (i) a thermally conductive top laser cooler disposed above and in thermal contact with the beam emitter and (ii) a thermally conductive bottom laser cooler disposed below and in thermal contact with the beam emitter. The cooling plate is disposed below the laser package. The barrier layer is disposed between the laser package and the cooling plate. The first thermal-interface material is disposed between the laser package and the barrier layer. The second thermal-interface material is disposed between the barrier layer and the cooling plate. Motion of the first and second thermal-interface materials away from the interface between the laser package and the cooling plate may be reduced.

Embodiments of the invention may include one or more of the following in any of a variety of combinations. The fastener may incorporate and/or mechanically engage with an elastic member. The fastener may compress the elastic member. The elastic member may be configured to be additionally compressed in response to thermally induced expansion of the laser package. The fastener may include, consist essentially of, or consist of one or more screws. The elastic member may include, consist essentially of, or consist of at least one spring. The beam emitter may include, consist essentially of, or consist of a diode bar configured to emit multiple discrete beams. The top laser cooler and/or the bottom laser cooler may include, consist essentially of, or consist of copper. The cooling plate may include, consist essentially of, or consist of aluminum. The barrier layer may include, consist essentially of, or consist of aluminum nitride. The first thermal-interface material and/or the second thermal-interface material may include, consist essentially of, or consist of a gel, a solder, a paste, or a liquid. The first thermal-interface material and/or the second thermal-interface material may include, consist essentially of, or consist of a phase-change material. The laser device may include a second laser package disposed over and/or fastened to the cooling plate. A bus bar may electrically connect the laser package to the second laser package. The second laser package may have a second beam emitter disposed therein. The electrically isolating barrier layer may include, consist essentially of, or consist of a plurality of discrete sections with gaps therebetween. The electrically isolating barrier layer may include, consist essentially of, or consist of one or more layers extending gaplessly between the laser package and the cooling plate. The first thermal-interface material and the second thermal-interface material may include, consist essentially of, or consist of the same material. The first thermal-interface material and the second thermal-interface material may include, consist essentially of, or consist of different materials.

In another aspect, embodiments of the invention feature a laser device including, consisting essentially of, or consisting of a beam emitter, a laser package, a thermally conductive cooling plate for conducting heat away from the laser package, an electrically isolating barrier layer for preventing electrical conduction between the laser package and the cooling plate, a thermal-interface material, and a fastener for attaching the laser package to the cooling plate, with the barrier layer and thermal-interface material therebetween, and allowing motion of the laser package in response to thermal cycles resulting from operation of the beam emitter. The laser package may include, consist essentially of, or consist of a thermally conductive bottom laser cooler disposed below and in thermal contact with the beam emitter. The laser package may include, consist essentially of, or consist of (i) a thermally conductive top laser cooler disposed above and in thermal contact with the beam emitter and (ii) a thermally conductive bottom laser cooler disposed below and in thermal contact with the beam emitter. The cooling plate is disposed below the laser package. The barrier layer is disposed between the laser package and the cooling plate. The thermal-interface material is disposed (i) between the laser package and the barrier layer or (ii) between the barrier layer and the cooling plate. Motion of the thermal-interface material away from the interface between the laser package and the cooling plate may be reduced.

Embodiments of the invention may include one or more of the following in any of a variety of combinations. The thermal-interface material may be disposed between the laser package and the barrier layer. The thermal-interface material may be disposed between the barrier layer and the cooling plate. The fastener may incorporate and/or mechanically engage with an elastic member. The fastener may compress the elastic member. The elastic member may be configured to be additionally compressed in response to thermally induced expansion of the laser package. The fastener may include, consist essentially of, or consist of one or more screws. The elastic member may include, consist essentially of, or consist of at least one spring. The beam emitter may include, consist essentially of, or consist of a diode bar configured to emit multiple discrete beams. The top laser cooler and/or the bottom laser cooler may include, consist essentially of, or consist of copper. The cooling plate may include, consist essentially of, or consist of aluminum. The barrier layer may include, consist essentially of, or consist of aluminum nitride. The thermal-interface material may include, consist essentially of, or consist of a gel, a solder, a paste, or a liquid. The thermal-interface material may include, consist essentially of, or consist of a phase-change material. The laser device may include a second laser package disposed over and/or fastened to the cooling plate. A bus bar may electrically connect the laser package to the second laser package. The second laser package may have a second beam emitter disposed therein. The electrically isolating barrier layer may include, consist essentially of, or consist of a plurality of discrete sections with gaps therebetween. The electrically isolating barrier layer may include, consist essentially of, or consist of one or more layers extending gaplessly between the laser package and the cooling plate.

In yet another aspect, embodiments of the invention feature a laser device including, consisting essentially of, or consisting of a beam emitter, a laser package, a thermally conductive cooling plate for conducting heat away from the laser package, a thermal-interface material, and means for attaching the laser package to the cooling plate, with the thermal-interface material therebetween, and allowing motion of the laser package in response to thermal cycles resulting from operation of the beam emitter. The laser package may include, consist essentially of, or consist of a thermally conductive bottom laser cooler disposed below and in thermal contact with the beam emitter. The laser package may include, consist essentially of, or consist of (i) a thermally conductive top laser cooler disposed above and in thermal contact with the beam emitter and (ii) a thermally conductive bottom laser cooler disposed below and in thermal contact with the beam emitter. The cooling plate is disposed below the laser package. The thermal-interface material is disposed between the laser package and the cooling plate. Motion of the thermal-interface material away from the interface between the laser package and the cooling plate may be reduced.

Embodiments of the invention may include one or more of the following in any of a variety of combinations. The attachment means may include, consist essentially of, or consist of an elastic member and a fastener, the fastener attaching the laser package to the cooling plate and compressing the elastic member. The elastic member may be configured to be additionally compressed in response to thermally induced expansion of the laser package. The fastener may include, consist essentially of, or consist of one or more screws. The elastic member may include, consist essentially of, or consist of at least one spring. The beam emitter may include, consist essentially of, or consist of a diode bar configured to emit multiple discrete beams. The top laser cooler and/or the bottom laser cooler may include, consist essentially of, or consist of copper. The cooling plate may include, consist essentially of, or consist of aluminum. The thermal-interface material may include, consist essentially of, or consist of a gel, a solder, a paste, or a liquid. The thermal-interface material may include, consist essentially of, or consist of a phase-change material. The laser device may include a second laser package disposed over and/or fastened to the cooling plate. A bus bar may electrically connect the laser package to the second laser package. The second laser package may have a second beam emitter disposed therein.

In another aspect, embodiments of the invention feature a laser device including, consisting essentially of, or consisting of a beam emitter, a laser package, a thermally conductive cooling plate for conducting heat away from the laser package, and an electrically isolating barrier layer for preventing electrical conduction between the laser package and the cooling plate. The laser package may include, consist essentially of, or consist of a thermally conductive bottom laser cooler disposed below and in thermal contact with the beam emitter. The laser package may include, consist essentially of, or consist of (i) a thermally conductive top laser cooler disposed above and in thermal contact with the beam emitter and (ii) a thermally conductive bottom laser cooler disposed below and in thermal contact with the beam emitter. The cooling plate is disposed below the laser package. The barrier layer is disposed between the laser package and the cooling plate. The electrically isolating barrier layer includes, consists essentially of, or consists of a plurality of discrete areal sections with gaps therebetween.

Embodiments of the invention may include one or more of the following in any of a variety of combinations. The beam emitter may include, consist essentially of, or consist of a diode bar configured to emit multiple discrete beams. The top laser cooler and/or the bottom laser cooler may include, consist essentially of, or consist of copper. The cooling plate may include, consist essentially of, or consist of aluminum. The barrier layer may include, consist essentially of, or consist of aluminum nitride. The laser device may include a second laser package disposed over and/or fastened to the cooling plate. A bus bar may electrically connect the laser package to the second laser package. The second laser package may have a second beam emitter disposed therein.

In yet another aspect, embodiments of the invention feature a laser device including, consisting essentially of, or consisting of a beam emitter, a laser package, a thermally conductive cooling plate for conducting heat away from the laser package, a thermal-interface material, and a fastener for attaching the laser package to the cooling plate, with the thermal-interface material therebetween, and allowing motion of the laser package in response to thermal cycles resulting from operation of the beam emitter. The laser package may include, consist essentially of, or consist of a thermally conductive bottom laser cooler disposed below and in thermal contact with the beam emitter. The laser package may include, consist essentially of, or consist of (i) a thermally conductive top laser cooler disposed above and in thermal contact with the beam emitter and (ii) a thermally conductive bottom laser cooler disposed below and in thermal contact with the beam emitter. The cooling plate is disposed below the laser package. The thermal-interface material is disposed between the laser package and the cooling plate. Motion of the thermal-interface material away from the interface between the laser package and the cooling plate may be reduced.

Embodiments of the invention may include one or more of the following in any of a variety of combinations. The fastener may incorporate and/or mechanically engage with an elastic member. The fastener may compress the elastic member. The elastic member may be configured to be additionally compressed in response to thermally induced expansion of the laser package. The fastener may include, consist essentially of, or consist of one or more screws. The elastic member may include, consist essentially of, or consist of at least one spring. The beam emitter may include, consist essentially of, or consist of a diode bar configured to emit multiple discrete beams. The top laser cooler and/or the bottom laser cooler may include, consist essentially of, or consist of copper. The cooling plate may include, consist essentially of, or consist of aluminum. The thermal-interface material may include, consist essentially of, or consist of a gel, a solder, a paste, or a liquid. The thermal-interface material may include, consist essentially of, or consist of a phase-change material. The laser device may include a second laser package disposed over and/or fastened to the cooling plate. A bus bar may electrically connect the laser package to the second laser package. The second laser package may have a second beam emitter disposed therein.

In another aspect, embodiments of the invention feature a laser device including, consisting essentially of, or consisting of a beam emitter, a laser package, a thermally conductive cooling plate for conducting heat away from the laser package, an electrically isolating barrier layer for preventing electrical conduction between the laser package and the cooling plate, a first thermal-interface material, and a second thermal-interface material. The laser package may include, consist essentially of, or consist of a thermally conductive bottom laser cooler disposed below and in thermal contact with the beam emitter. The laser package may include, consist essentially of, or consist of (i) a thermally conductive top laser cooler disposed above and in thermal contact with the beam emitter and (ii) a thermally conductive bottom laser cooler disposed below and in thermal contact with the beam emitter. The cooling plate is disposed below the laser package. The barrier layer is disposed between the laser package and the cooling plate. The first thermal-interface material is disposed between the laser package and the barrier layer. The second thermal-interface material is disposed between the barrier layer and the cooling plate.

Embodiments of the invention may include one or more of the following in any of a variety of combinations. The beam emitter may include, consist essentially of, or consist of a diode bar configured to emit multiple discrete beams. The top laser cooler and/or the bottom laser cooler may include, consist essentially of, or consist of copper. The cooling plate may include, consist essentially of, or consist of aluminum. The barrier layer may include, consist essentially of, or consist of aluminum nitride. The first thermal-interface material and/or the second thermal-interface material may include, consist essentially of, or consist of a gel, a solder, a paste, or a liquid. The first thermal-interface material and/or the second thermal-interface material may include, consist essentially of, or consist of a phase-change material. The laser device may include a second laser package disposed over and/or fastened to the cooling plate. A bus bar may electrically connect the laser package to the second laser package. The second laser package may have a second beam emitter disposed therein. The electrically isolating barrier layer may include, consist essentially of, or consist of a plurality of discrete sections with gaps therebetween. The electrically isolating barrier layer may include, consist essentially of, or consist of one or more layers extending gaplessly between the laser package and the cooling plate. The first thermal-interface material and the second thermal-interface material may include, consist essentially of, or consist of the same material. The first thermal-interface material and the second thermal-interface material may include, consist essentially of, or consist of different materials.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean±10%, and in some embodiments, ±5%. The term "consists essentially of" means excluding other materials that contribute to function, unless otherwise defined herein. Nonetheless, such other materials may be present, collectively or individually, in trace amounts. For example, a structure "consisting essentially of" one or more materials may include the one or more materials and unintentional impurities (e.g., impurities not intentionally introduced and/or present at insufficient concentrations to contribute to function; such impurities may be detectable via chemical analysis). Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
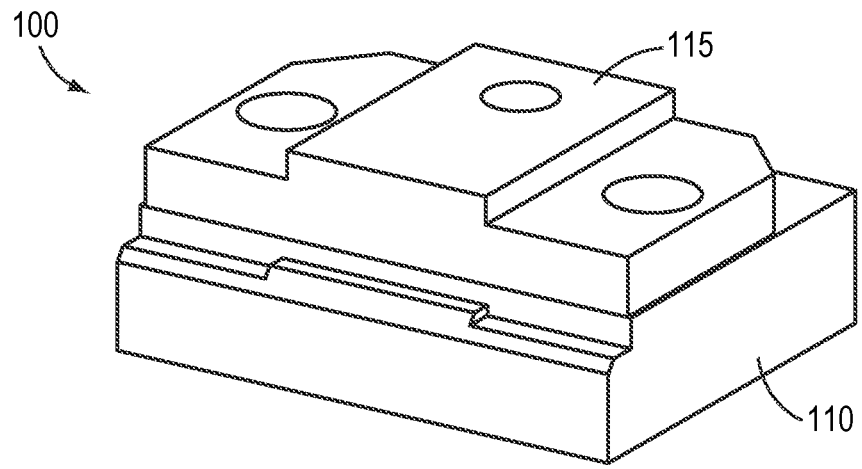
FIG. 1 is a perspective view of an exemplary laser package in accordance with various embodiments of the invention.
Figure 2:
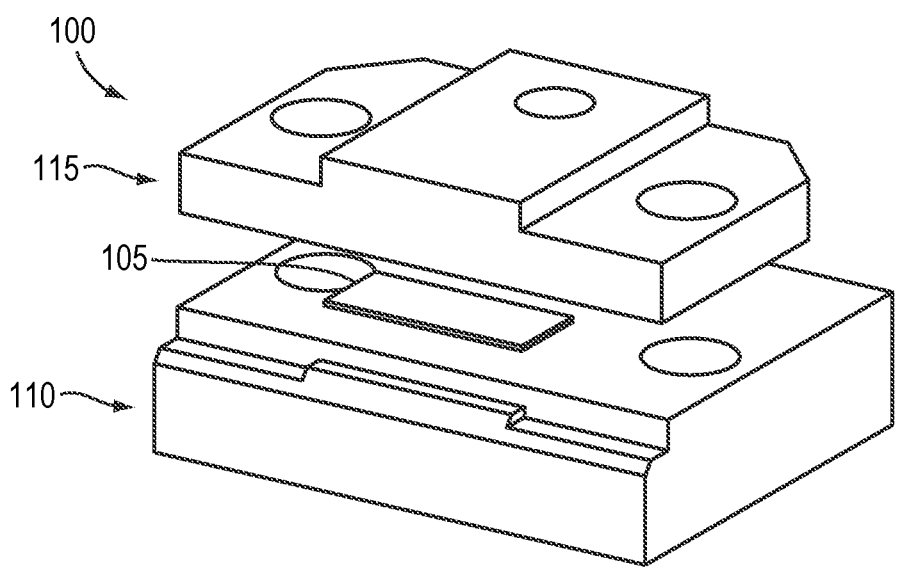
FIG. 2 is an exploded view of the laser package of FIG. 1.

FIGS. 1 and 2 depict an exemplary laser package 100 utilized in accordance with embodiments of the present invention. As shown, in laser package 100 a beam emitter 105 is sandwiched between a bottom laser cooler 110 and a top laser cooler 115. The beam emitter 105 may include, consist essentially of, or consist of, e.g., a laser diode, a diode bar, an array of laser diodes, an array of diode bars, or one or more vertical cavity surface-emitting lasers (VCSELs). The laser coolers 110, 115 are thermally connected to the beam emitter 105 and each electrically connected to one of the electrodes (i.e., the anode and the cathode) of the beam emitter 105. For example, the bottom laser cooler 110 may be electrically connected to the anode of beam emitter 105 and the top laser cooler 115 may be electrically connected to the cathode of beam emitter 105, or vice versa. The laser coolers 110, 115 are typically highly thermally and electrically conductive; thus, in various embodiments, the laser coolers 110, 115 include, consist essentially of, or consist of one or more metals such as copper, silver, or gold. An electrically insulating layer and/or material may be disposed between the laser coolers 110, 115 (or portions thereof) such that the only electrical connection therebetween is through the beam emitter 105 itself.

One or both of laser coolers 110, 115 may include features and/or materials as described in U.S. patent application Ser. No. 14/666,438, filed on Mar. 24, 2015, the entire disclosure of which is incorporated by reference herein. One or both of laser coolers 110, 115 and/or laser package 100 may be actively liquid-cooled, for example as described in U.S. patent application Ser. No. 15/627,917, filed on Jun. 20, 2017, the entire disclosure of which is incorporated by reference herein.

Figure 3:
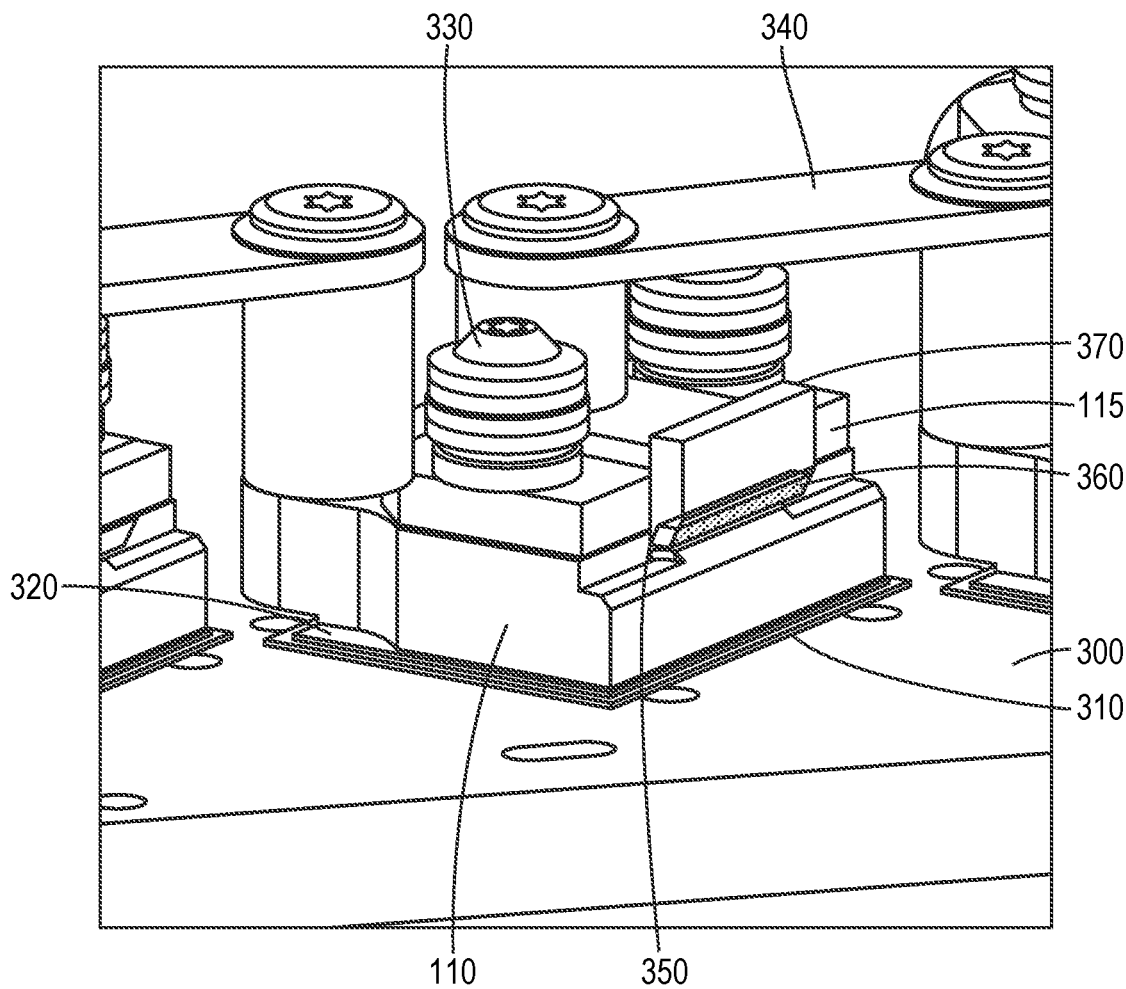
FIG. 3 is a view of an exemplary laser package installed on a cooling plate in accordance with various embodiments of the invention.

FIG. 3 depicts an exemplary embodiment of the present invention in which the laser package 100 is installed on a cooling plate 300. As shown, an electrically insulating barrier 310 may be disposed between the laser package 100 and the cooling plate 300, and a thermal-interface material 320 may be disposed between the laser package 100 and the electrically insulating barrier 310. In various embodiments, an additional layer of thermal-interface material may be disposed between the electrically insulating barrier 310 and the cooling plate 300. In various embodiments, either or both of the thermal-interface materials may include, consist essentially of, or consist of, for example, a metallic liquid or paste (e.g., a liquid or paste including, consisting essentially of, or consisting of indium), and/or a thermally conductive, electrically insulating solid film or foil (e.g., a film or foil including, consisting essentially of, or consisting of silicone incorporating one or more filler materials such as boron nitride).

The cooling plate 300 may include, consist essentially of, or consist of one or more thermally conductive materials such as copper, aluminum, and/or silver. In various embodiments, the cooling plate may incorporate or define therewithin recesses and/or channels (not shown in FIG. 3) for flow of a cooling fluid (e.g., water or a glycol) to provide active cooling to laser package 100. A coolant source and coolant sink may be connected to the cooling channels, and a coolant reservoir and, e.g., a heat exchanger, may be fluidly connected to the cooling channel and provide coolant thereto. Such cooling systems are conventional and may be utilized with embodiments of the present invention without undue experimentation. Cooling channels within the cooling plate 300 may be simple conduits and/or conduits or conduit networks that include complex features such as turns, branches, etc.

In various embodiments, the electrically insulating barrier 310 may be omitted, and only a single layer of thermal-interface material 320 may be disposed between the laser package 100 and the cooling plate 300. For example, the cooling plate may be electrically resistive or have disposed thereon an electrically insulating layer, and/or the bottom laser cooler 110 may have an electrically insulating layer disposed at least on its bottom surface to prevent electrical conduction from the laser package 100 to the cooling plate 300.

As shown in FIG. 3, the bottom laser cooler 110 and the top laser cooler 115 may be fastened together via one or more fasteners 330, e.g., screws. In various embodiments, the fasteners extend into holes defined in the cooling plate 300 and may be threaded to engage with complementary threads defined in the holes in the cooling plate 300. As also shown in FIG. 3, in embodiments in which multiple laser packages 100 are attached to a shared cooling plate 300, the laser packages 100 may be electrically connected to each other via one or more bus bars 340. For example, as shown, the laser coolers 110, 115 may incorporate or have attached thereto electrically conductive posts to which the bus bars 340 are connected. The bus bars 340 may include, consist essentially of, or consist of an electrically conductive material, e.g., a metal such as copper. In various embodiments, the bus bars 340 are configured (e.g., sized and shaped) to carry current from laser package 100 with minimal resistive loss. As shown in FIG. 3, adjoining laser packages 100 may be electrically connected in series, i.e., the top laser cooler from one (and thus one electrode of the corresponding beam emitter) may be connected to the bottom laser cooler from the next (and thus the opposite electrode of the next beam emitter). Bus bars 340 may also be utilized to connect laser packages 100 to other electronic devices and/or sources of electrical power (e.g., current sources).

As shown in FIG. 3, in various embodiments of the present invention, the beam emitter 105 (disposed between the bottom laser cooler 110 and top laser cooler 115, and not clearly visible in FIG. 3) is associated with (e.g., attached or otherwise optically coupled to) a fast-axis collimator (FAC)/optical twister microlens assembly that collimates the fast axis of the emitted beams while rotating the fast and slow axes of the beams by 90°, such that the slow axis of each emitted beam is perpendicular to the WBC dimension downstream of the microlens assembly. As shown, the microlens assembly may include, consist essentially of, or consist of a FAC 350 and an optical twister (or optical rotator) 360, which may be mechanically supported by a holder 370. The microlens assembly may also, in WBC embodiments, converges the chief rays of the emitters from the beam emitter 105 (and/or other beam emitters in the laser device) toward a downstream dispersive element for combining into a single multi-wavelength beam. Suitable microlens assemblies are described in U.S. Pat. No. 8,553,327, filed on Mar. 7, 2011, and U.S. Pat. No. 9,746,679, filed on Jun. 8, 2015, the entire disclosure of each of which is hereby incorporated by reference herein.

Figure 4:
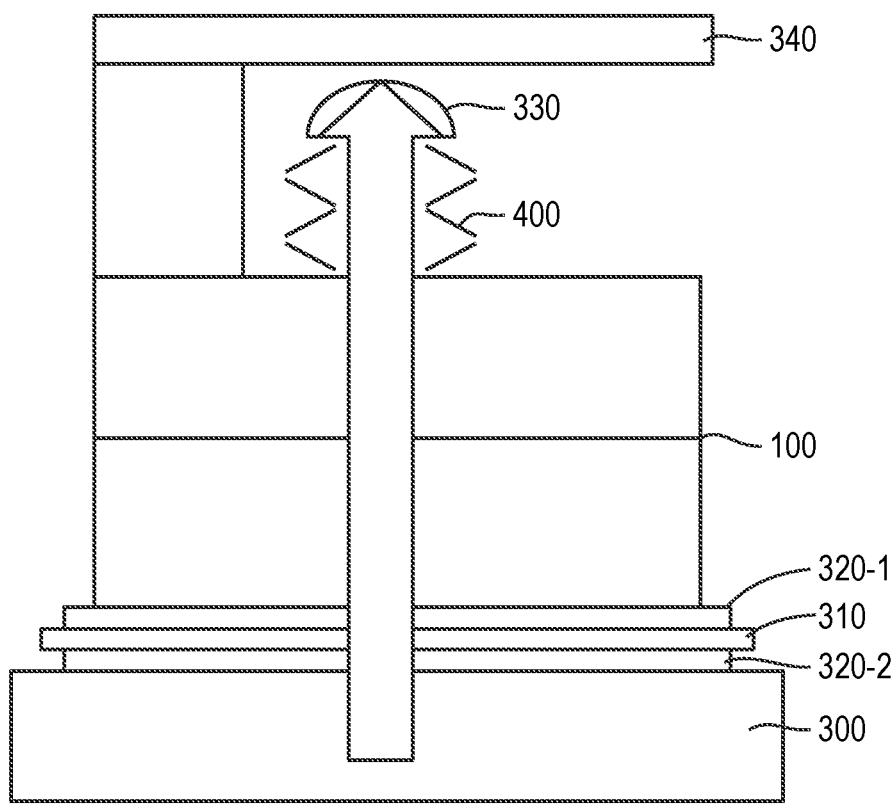
FIG. 4 is a schematic cross-sectional view of a an exemplary laser package installed on a cooling plate in accordance with various embodiments of the invention.

FIG. 4 is a cross-sectional schematic diagram of a laser package 100 attached to cooling plate 300 in accordance with embodiments of the present invention. As shown, embodiments of the invention feature a first thermal-interface material 320-1 between the laser package 100 and the electrically insulating barrier 310, as well as a second thermal-interface material 320-2 between the electrically insulating barrier 310 and the cooling plate 300. In various embodiments, the thermal-interface materials 320-1, 320-2 include, consist essentially of, or consist of the same material, while in other embodiments, the thermal-interface materials 320-1, 320-2 include, consist essentially of, or consist of different materials. In various embodiments, the electrically insulating barrier 310 may be divided into discrete sections, as detailed below. Thus, in embodiments of the invention, the electrically insulating barrier 310 may not occupy the entire area of the interface between the laser package 100 and the cooling plate 300.

As shown in FIG. 4, a spring 400 may be disposed between a top section (e.g., a head) of fastener 330 and the laser package 100, thereby enabling the laser package 100 to more freely move (e.g., expand and/or contract) during, for example, thermal cycles associated with operation of the beam emitter 105. For example, the laser package 100 may move, expand, and/or contract laterally or longitudinally (i.e., along the interface) and/or transversely (i.e., away from, e.g., perpendicular to, the interface). In various embodiments, the spring 400 may include, consist essentially of, or consist of a metal (e.g., stainless steel), a metal alloy, or a high-temperature-resistant polymer, fluoropolymer, elastomer, or plastic material. In various embodiments, the springs 400 may be electrically conductive or electrically insulating. In various embodiments, an electrically insulating barrier layer or barrier material may be disposed between the spring 400 and the laser package 100 to prevent electrical conduction therebetween. For example, a washer including, consisting essentially of, or consisting of an electrically insulating material (e.g., a thermoplastic or polymeric material such as polyetherimide) may be disposed on or around the fastener 330 and/or between the spring 400 and the laser package 100.

As utilized herein, the term "spring" includes any elastic entity, member, or object that reversibly stores mechanical energy. Exemplary springs 400 include coil springs, wave springs, disc springs, leaf springs, Belleville springs (i.e., coned disc springs), and/or bellows. The spring 400 may operate in accordance with Hooke's law when compressed and/or stretched as contemplated herein, and may thus be characterized by a spring constant k. In various embodiments, the spring 400 is configured to therefore exert a nominal force $F_n = k \times x_n$ when compressed at a compression $x_n$ from the rest length (where $x_n$ is within the deformation range in which Hooke's law governs). The spring 400 thereby compresses the thermal-interface material 320 (e.g., thermal-interface material 320-1 and/or 320-2, if one or both are present) and maintains the thermal connection between the laser package 100 and the cooling plate 300.

In addition, in various embodiments, the spring 400 is configured (e.g., the spring constant k and/or nominal compression $x_n$ are selected) such that, during a typical thermal cycle (i.e. temperature change) ΔT of laser package 100 (e.g., during operation), the force exerted by the spring 400 is no more than approximately 100% more than (i.e., twice) the force $F_n$. That is, in various embodiments the thermal cycle does not result in additional compression of the spring 400 sufficient to increase the force exerted by the spring 400 (i.e., when not heated, e.g., when at room temperature) by more than approximately 100%. In some embodiments, the force exerted by the spring 400 is no more than approximately 50% more, or no more than approximately 10% more than $F_n$. The compression of the spring 400 resulting from the thermal expansion of the laser package 100 may be $\Delta x = CTE \times \Delta T \times x_n$, where CTE represents the CTE of the laser package 100. For example, in an illustrative example, the nominal compression $x_n$ of a spring 400 corresponding to a plurality of Belleville springs is approximately 200 μm, and the spring constant k is approximately $3.28 \times 10^6$ N/m. For a beam emitter having a height h of 10 mm, and a laser package composed of copper (having a CTE of approximately 16 ppm), and for a $\Delta T$ of 100° C., the additional thermal compression corresponds to $\Delta x = CTE \times \Delta T \times h =$ approximately 16 μm. Thus, the additional force exerted by the spring 400 during the thermal cycle is $\Delta F = k \times \Delta x =$ approximately 52.5 N. Based on the nominal compression of the spring 400, the nominal force $F_n$ is equal to $k \times \Delta x_n$ approximately 656 N. Therefore, the force exerted by the spring 400 during the thermal cycle, in this illustrative example, is $\Delta F/F_n$, or approximately 8%.

In various embodiments of the invention, therefore, the use of the springs 400 in conjunction with fasteners 330 may reduce or substantially eliminate the thermal pumping and concomitant loss of thermal-interface material 320 from the interface between the laser package 100 and the cooling plate 300. That is, the motion or loss of the thermal-interface material(s) 320 from the interface is reduced (i.e., compared to cases in which fasteners without springs 400 are utilized and/or thermal-induced motion of the laser package 100 is constrained or prevented) or substantially eliminated. In various embodiments, the spring 400 is separate from and disposed around the fastener 330, while in other embodiments the spring 400 is attached to, or even part of, the fastener 330. All or part of the portion of the fastener 330 extending into the cooling plate 300 may be threaded, and the hole defined in the cooling plate 300 may be complementarily threaded for anchoring of the fastener 330. The fasteners 330 may include, consist essentially of, or consist of, e.g., a metal such as stainless steel. An electrically insulating coating or layer may be disposed on the outside surface of the fastener 330 in order to prevent electrical connection or shorting between various components of laser system through the fastener 330.

Figure 5:
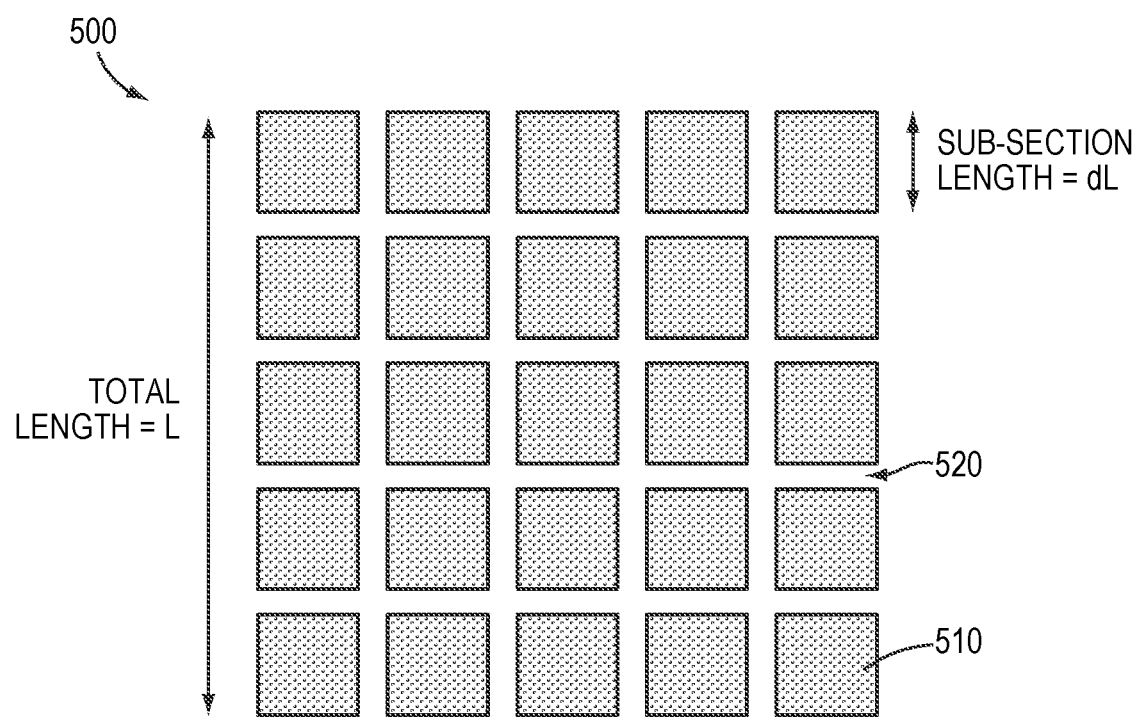
FIG. 5 is a schematic plan view of a divided electrically insulating barrier in accordance with various embodiments of the invention.

In addition to or instead of the use of springs 400 in conjunction with fasteners 300, laser systems in accordance with embodiments of the invention may incorporate an electrically insulating barrier 310 that is divided into multiple discrete area-wise (or "areal") regions for reduction of thermal pumping effects (due to, e.g., CTE mismatch between the electrically insulating barrier and the beam emitter and/or laser package). FIG. 5 is a schematic plan view of a divided electrically insulating barrier 500 that may correspond to electrically insulating barrier 310 in FIG. 4. As shown, the electrically insulating barrier 500 may be divided into two or more discrete sections 510 separated by gaps 520 therebetween. In various embodiments, during thermal cycling of the laser system, each of the sections 510 may expand, e.g., in response to CTE mismatch-induced pumping, independent of the others. Thus, the total expansion or movement of the electrically insulating barrier 500 may be decreased by a factor corresponding to the number of sections 510 per unit length (e.g., dL/L in the exemplary embodiment illustrated in FIG. 5). The thermally induced pumping of the thermal-interface material 320-1 and/or thermal-interface material 320-2 may therefore decrease by approximately the same factor. In various embodiments, the sections 510 may not be equally spaced apart, i.e., the gaps 520 may vary in width. Moreover, the sizes of the sections 510 may vary across the area of the electrically insulating barrier 500. For example, areas of the electrically insulating barrier 500 disposed beneath regions of laser package 100 that experience higher maximum temperatures and/or larger thermal cycles may be divided into smaller sections 510, compared to other portions of electrically insulating barrier 500. In various embodiments, the gaps 520 between sections may be different (e.g., smaller or larger) beneath regions of laser package 100 that experience higher maximum temperatures and/or larger thermal cycles (e.g., directly below the beam emitter) than in other portions of the electrically insulating barrier.

In various embodiments, the electrically insulating barrier 500 may be applied between the laser package 100 and the cooling plate 300 (e.g., with one or both of thermal-interface materials 320-1, 320-2 present) as a plurality of discrete sections 510. In other embodiments, the electrically insulating barrier 500 is applied as a single uniform layer at the interface, and portions of the material are removed to form the gaps 520 between the discrete sections 510. For example, one or more portions of the material may be removed via etching (e.g., after masking remaining regions). In various embodiments, one or more of the sections 510 may be regularly shaped (e.g., squares, other polygons, or circles), or one or more of the sections 510 may be irregularly shaped. Similarly, the gaps 520 may not be uniform in width across their entire lengths and may vary in width in a regular or irregular pattern. As shown in FIG. 5, when viewed in plan view, one or more, or even all, of the sections 510 may be regular polygons (or circles) in which all of the sides of the section 510 have approximately the same length. (That is, in various embodiments, the sections 510 have shapes different from irregular shapes that would result from the pressing of a liquid or gel material or the introduction of such a material within a small space.) In various embodiments, when viewed from the side or in cross-section, each section 510 may have substantially the same thickness across its lateral dimension (and two or more, or even all, of the sections 510 may have substantially the same thickness as each other), and/or the sidewalls of the section 510 may be substantially perpendicular to the top and bottom surfaces of the section 510, which may be parallel to each other. In various embodiments, one or more (or even all) of the sections 510 may extend across an entire lateral dimension (e.g., length or width) of cooler 110 (e.g., in the manner of "strips" or "stripes"), while one or more other sections may be smaller. In various embodiments, portions of one or more of the sections 510 may extend out from beneath the cooler 110, for example as shown in FIGS. 3 and 4.

In various embodiments, the divided electrically insulating barrier layer 500 is utilized with thermal interface material 320-1 and/or thermal interface material 320-2 that is also electrically insulating, in order to prevent inadvertent electrical conduction between the laser package 100 and the cooling plate 300 within one or more of the gaps 520. In various embodiments, a compliant or flexible material (e.g., a compliant epoxy) may be disposed within one or more of the gaps 520 to prevent inadvertent electrical conduction between the laser package 100 and the cooling plate 300.

In various embodiments, the thermal-interface material 320 (e.g., thermal-interface material 320-1 and/or thermal interface material 320-2) and/or portions of components in contact therewith may be sealed with a sealing material to further minimize or prevent creep or movement of the thermal-interface material, for example as described in U.S. patent application Ser. No. 15/006,733, filed Jan. 26, 2016, the entire disclosure of which is incorporated by reference herein.

Figure 6:
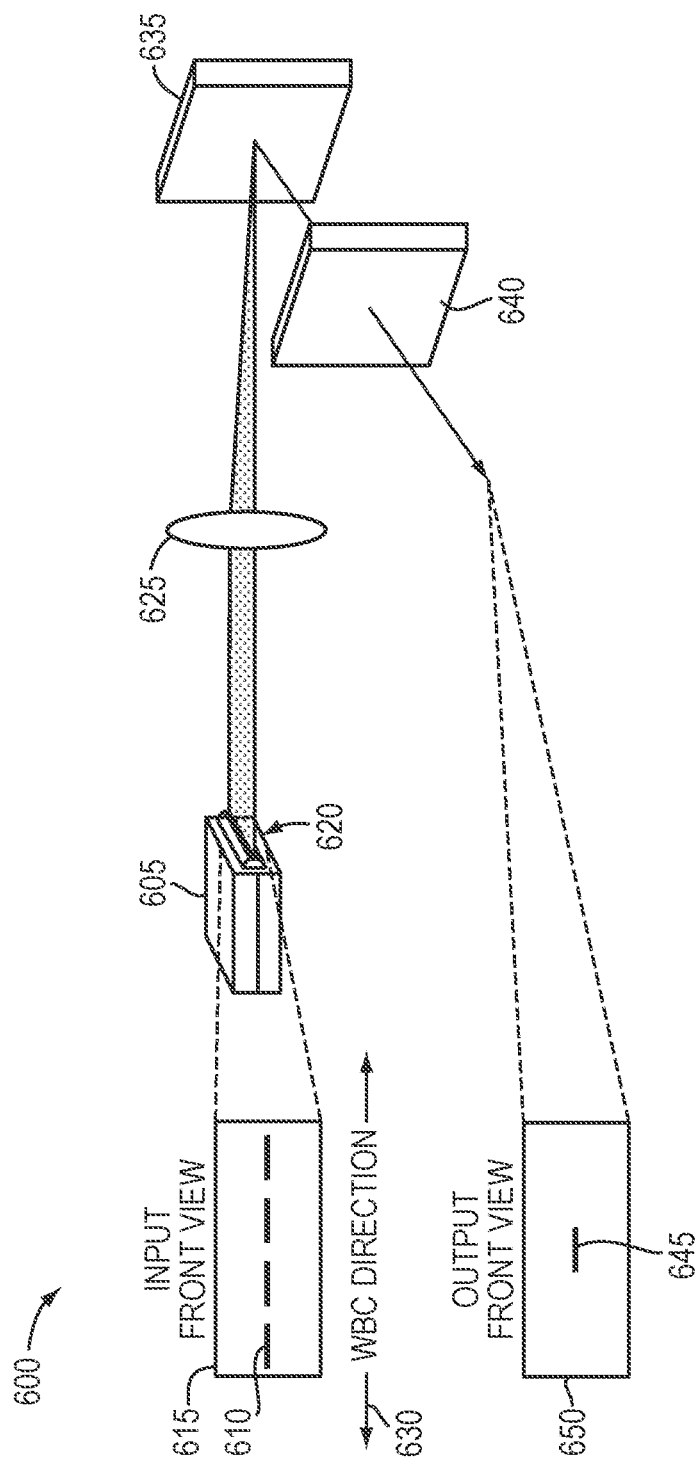
FIG. 6 is a schematic view of a wavelength beam combining laser system incorporating a packaged laser in accordance with various embodiments of the invention.

Packaged lasers in accordance with embodiments of the present invention may be utilized in WBC laser systems. FIG. 6 depicts an exemplary WBC laser system 600 that utilizes a packaged laser 605. The packaged laser 605 may include, consist essentially of, or consist of, for example, laser package 100 as detailed herein, which may be disposed on a cooling plate 300 as detailed herein. In the example of FIG. 6, laser 605 features a diode bar having four beam emitters emitting beams 610 (see magnified input view 615), but embodiments of the invention may utilize diode bars emitting any number of individual beams or two-dimensional arrays or stacks of diodes or diode bars. In view 615, each beam 610 is indicated by a line, where the length or longer dimension of the line represents the slow diverging dimension of the beam, and the height or shorter dimension represents the fast diverging dimension. A collimation optic 620 may be used to collimate each beam 610 along the fast dimension. Transform optic(s) 625, which may include, consist essentially of, or consist of one or more cylindrical or spherical lenses and/or mirrors, are used to combine each beam 610 along a WBC direction 630. The transform optics 625 then overlap the combined beam onto a dispersive element 635 (which may include, consist essentially of, or consist of, e.g., a diffraction grating such as a reflective or transmissive diffraction grating), and the combined beam is then transmitted as single output profile onto an output coupler 640. The output coupler 640 then transmits the combined beams 645 as shown on the output front view 650. The output coupler 640 is typically partially reflective and acts as a common front facet for all the laser elements in this external cavity system 600. An external cavity is a lasing system where the secondary mirror is displaced at a distance away from the emission aperture or facet of each laser emitter. In some embodiments, additional optics are placed between the emission aperture or facet and the output coupler or partially reflective surface.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. A laser device comprising:
a beam emitter;
a laser package comprising (i) a thermally conductive top laser cooler disposed above and in thermal contact with the beam emitter and (ii) a thermally conductive bottom laser cooler disposed below and in thermal contact with the beam emitter;
disposed below the laser package, a thermally conductive cooling plate for conducting heat away from the laser package;
disposed between the laser package and the cooling plate, an electrically isolating barrier layer for preventing electrical conduction between the laser package and the cooling plate;
a first thermal-interface material disposed between the laser package and the electrically isolating barrier layer;
a second thermal-interface material disposed between the electrically isolating barrier layer and the cooling plate; and
means for attaching the laser package to the cooling plate, with the electrically isolating barrier layer and first and second thermal-interface materials therebetween, and allowing motion of the laser package in response to thermal cycles resulting from operation of the beam emitter, whereby motion of the first and second thermal-interface materials away from the interface between the laser package and the cooling plate is reduced,
wherein the electrically isolating barrier layer comprises a plurality of discrete and spaced-apart areal sections with gaps therebetween, each gap extending from the first thermal-interface material disposed above the gap to the second thermal-interface material disposed below the gap.

2. The device of claim 1, wherein the attachment means comprises an elastic member and a fastener, the fastener attaching the laser package to the cooling plate and compressing the elastic member, wherein the elastic member is configured to be additionally compressed in response to thermally induced expansion of the laser package.

3. The device of claim 2, wherein the fastener comprises a screw.

4. The device of claim 2, wherein the elastic member comprises at least one spring.

5. The device of claim 1, wherein the beam emitter comprises a diode bar configured to emit multiple discrete beams.

6. The device of claim 1, wherein at least one of the top laser cooler or the bottom laser cooler comprises copper.

7. The device of claim 1, wherein the cooling plate comprises aluminum.

8. The device of claim 1, wherein the electrically isolating barrier layer comprises aluminum nitride.

9. The device of claim 1, wherein at least one of the first thermal-interface material or the second thermal-interface material comprises a gel, a solder, a paste, or a liquid.

10. The device of claim 1, wherein at least one of the first thermal-interface material or the second thermal-interface material comprises a phase-change material.

11. The device of claim 1, further comprising:
a second laser package disposed over the cooling plate; and
a bus bar electrically connecting the laser package to the second laser package.

12. The device of claim 1, wherein the first thermal-interface material and the second thermal-interface material comprise the same material.

13. The device of claim 1, wherein the first thermal-interface material and the second thermal-interface material comprise different materials.

14. The device of claim 1, wherein at least one of the first thermal-interface material or the second thermal-interface material is electrically insulating.

15. The device of claim 1, wherein at least one of the gaps is devoid of material therewithin.

16. A laser device comprising:
a beam emitter;
a laser package comprising (i) a thermally conductive top laser cooler disposed above and in thermal contact with the beam emitter and (ii) a thermally conductive bottom laser cooler disposed below and in thermal contact with the beam emitter;

disposed below the laser package, a thermally conductive cooling plate for conducting heat away from the laser package;

disposed between the laser package and the cooling plate, an electrically isolating barrier layer for preventing electrical conduction between the laser package and the cooling plate;

a first thermal-interface material disposed between the laser package and the electrically isolating barrier layer;

a second thermal-interface material disposed between the electrically isolating barrier layer and the cooling plate; and a fastener for attaching the laser package to the cooling plate, with the electrically isolating barrier layer and first and second thermal-interface materials therebetween, and allowing motion of the laser package in response to thermal cycles resulting from operation of the beam emitter, whereby motion of the first and second thermal-interface materials away from the interface between the laser package and the cooling plate is reduced, wherein (i) the fastener incorporates or mechanically engages with an elastic member, (ii) the fastener is configured to compress the elastic member at room temperature when the beam emitter is not operating, thereby applying a force to the laser package that is equal to a nominal force, and (iii) the elastic member is configured to be additionally compressed in response to thermally induced expansion of the laser package during operation of the beam emitter, thereby increasing the force applied to the laser package by no more than 100% of the nominal force.

17. The device of claim 16, wherein the elastic member comprises at least one spring.

18. The device of claim 16, wherein the fastener comprises a screw.

19. The device of claim 16, wherein the first thermal-interface material and the second thermal-interface material comprise the same material.

20. The device of claim 16, wherein the first thermal-interface material and the second thermal-interface material comprise different materials.

21. The device of claim 16, wherein the elastic member is configured such that the additional compression of the elastic member during operation of the beam emitter increases the force applied to the laser package by no more than 50% of the nominal force.

22. The device of claim 16, wherein the elastic member is configured such that the additional compression of the elastic member during operation of the beam emitter increases the force applied to the laser package by no more than 10% of the nominal force.

23. The device of claim 16, further comprising an electrically insulating material disposed between the elastic member and the laser package to prevent electrical conduction between the elastic member and the laser package.

24. The device of claim 16, wherein the elastic member is electrically insulating.

25. The device of claim 1, wherein:
a first region of the electrically insulating barrier material is disposed vertically beneath the beam emitter; and
a second region of the electrically insulating barrier material is not disposed vertically beneath the beam emitter.

26. The device of claim 25, wherein a width of one or more areal sections of the electrically insulating barrier layer in the first region is smaller than a width of one or more areal sections of the electrically insulating barrier layer in the second region.

27. The device of claim 25, wherein a width of one or more gaps between areal sections of the electrically insulating barrier layer in the first region is different from a width of one or more gaps between areal sections of the electrically insulating barrier layer in the second region.

* * * * *